United States Patent [19]

Weimer

[11] 4,001,501
[45] * Jan. 4, 1977

[54] SIGNAL PROCESSING CIRCUITS FOR CHARGE-TRANSFER, IMAGE-SENSING ARRAYS

[75] Inventor: Paul Kessler Weimer, Princeton, N.J.

[73] Assignee: RCA Corporation, New York, N.Y.

[ * ] Notice: The portion of the term of this patent subsequent to Nov. 11, 1992, has been disclaimed.

[22] Filed: Sept. 18, 1974

[21] Appl. No.: 507,217

Related U.S. Application Data

[62] Division of Ser. No. 356,324, May 2, 1973, Pat. No. 3,876,952.

[52] U.S. Cl. .............. 358/160; 357/24; 357/30; 250/208; 250/211 J; 358/167; 358/213
[51] Int. Cl.² .............. H04N 3/14; H01L 29/78; H01L 31/00; H01J 39/12
[58] Field of Search ........... 357/24, 30; 250/211 J, 250/208, 238, 240, 242, 330, 332–334, 370, 371, 578; 178/DIG. 8, 6, 6.8, 7.1, 7.2, DIG. 25; 307/311

[56] References Cited

UNITED STATES PATENTS

| | | | |
|---|---|---|---|
| 3,581,109 | 5/1971 | Olsson et al. | 178/DIG. 8 |
| 3,704,342 | 11/1972 | Stoddard et al. | 178/DIG. 8 |
| 3,723,642 | 3/1973 | Laakmann | 250/332 |
| 3,751,586 | 8/1973 | Johansson | 178/DIG. 8 |
| 3,806,729 | 4/1974 | Caywood | 250/211 J |
| 3,840,740 | 10/1974 | Stewart | 357/30 |
| 3,845,295 | 10/1974 | Williams et al. | 250/211 J |
| 3,869,565 | 3/1975 | Olsson | 250/333 |
| 3,919,468 | 11/1975 | Weimer | 178/7.1 |

*Primary Examiner*—John C. Martin
*Attorney, Agent, or Firm*—H. Christoffersen; Samuel Cohen

[57] ABSTRACT

During the serial shifting to an output buffer of the radiation induced charge signal accumulated in a row (or column) of an array, the successive signals are processed to improve the contrast of the sensed image. The portion of each signal of greater than a given amplitude is transmitted to a buffer stage and the remaining portion of each signal is removed. In one form of the invention, the signal-to-noise ratio is then enhanced at the expense of resolution by combining at the buffer the processed signal from a number of adjacent charge storage locations.

2 Claims, 8 Drawing Figures

SIGNAL PROCESSING CIRCUITS FOR CHARGE-TRANSFER, IMAGE-SENSING ARRAYS

This is a division of application Ser. No. 356,324, now U.S. Pat. No. 3,876,952 filed May 2, 1973.

A problem which exists in viewing scenes in certain regions of the radiation spectrum, such as in the infrared, is that although the scene brightness is high the contrast is very low—of the order of 0.1–0.5% for a temperature difference $\Delta T$ of 0.1° Kelvin (K). What this means in terms of image sensing arrays is that the amount of signal of interest is only a very small part of the total radiation reaching the array. When two such charge signals are compared or reproduced, the contrast between them is quite small.

The problem above becomes particularly troublesome when the technique described in copending application, titled "Charge Transfer Circuits", Ser. No. 309,755, now U.S. Pat. No. 3,919,755, filed Nov. 27, 1972, by the present inventor and assigned to the same assignee as the present application, is employed for increasing the radiation induced signal amplitude. This technique involves accumulating at a summing stage the signal produced at say two or three or more adjacent light sensors in the array to thereby obtain a total signal amplitude equal to the sum of the signals present at these sensors, at the expense of signal resolution. When the signals being sensed are relatively large-amplitude signals consisting mostly of background signals, the summing stages must have very large capacities and this is undesirable because they require too much space. It is also undesirable because the major part of each summed signal will still be background so that the contrast among the signals, while somewhat improved, will still be relatively poor.

The problem above exists also in cases where the background signal portion of the signals being summed is a residual signal purposely introduced to enhance transfer efficiency. As is now understood in this art, such purposely introduced signals, sometimes known as "fat zero" signals, may occupy 25% of the capacity of a potential well formed at the substrate surface beneath a charge storage electrode of, for example, a charge coupled register. Making the assumption, which is a valid one, that the summing stage should have about the same charge storage capacity as the charge storage stage, then even if the useful intelligence is zero, the signal present at no more than four elements of an array could be summed. In practice, of course, the useful signal may, in the best case, be substantially larger than zero and may even be larger than the fat zero signal. This means that, in practice, the maximum number of signals which could be combined would be limited.

In a system embodying the present invention, the charge signal is processed to improve the contrast of the sensed image by passing only that portion of each signal of greater than a given amplitude to a second stage and removing the remaining portion of each signal. In one form of the invention, the seccond stage also performs a summing function, that is, it adds the processed signals derived from a number of successive array stages to enhance the signal-to-noise ratio. The invention is illustrated in the drawing of which:

Figure 1:
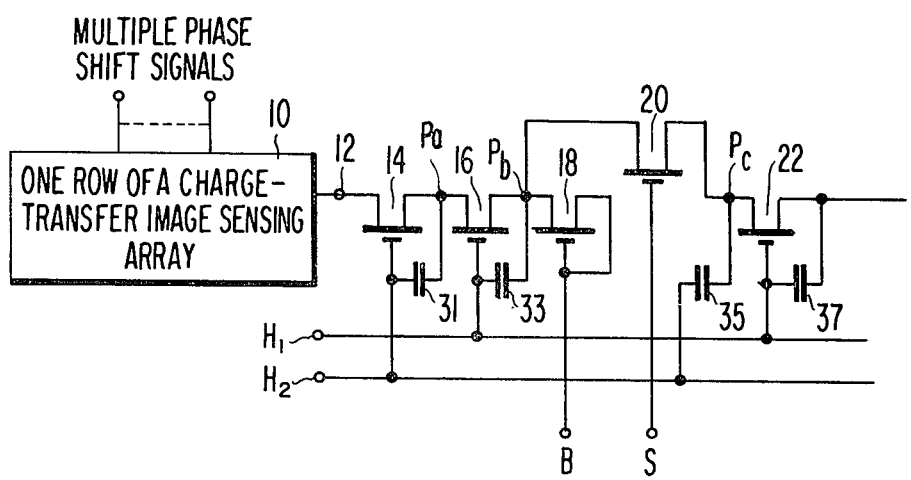
FIG. 1 is a block and schematic circuit diagram of a bucket-brigade embodiment of the invention.

In the circuit of FIG. 1, block 10 represents one row of a charge-transfer image-sensing array. The row may be a horizontal or a vertical row and may comprise any suitable form of charge transfer radiation sensing circuit. For example, the row may be a row of charge-coupled visible light or infrared or other radiation sensing array or it may be a row of a bucket brigade radiation sensing array.

Arrays such as discussed above are well known. In their operation, during an integration time, sometimes also known as an image receiving time, the array has an image projected thereon. The potentials applied to the elements of the arrays are such that the radiation induced charges produced in the array are stored at the charge locations associated with the sensors of the array. At the end of each integration time, which integration time may be 1/30th of a second or more depending upon the scene intensity, multiple phase shift signals are applied to the array for shifting the charges present in each row of the array to the output terminal 12 of each row.

As already mentioned in the introductory portion of this application, in certain regions of the radiation spectrum the successive output signals will comprise mostly background signal with a small portion of each signal representing intelligence. The circuit shown in schematic form in FIG. 1 is for the purpose of improving the contrast of the sensed image.

The circuit of FIG. 1 includes transistors 14, 16, 18, 20 and 22 illustrated as insulated gate field effect transistors. The transistors 14, 16 and 22 are so called bucket-brigade stages. Each has a capacitor connected between its gate and drain electrodes.

Figure 2:
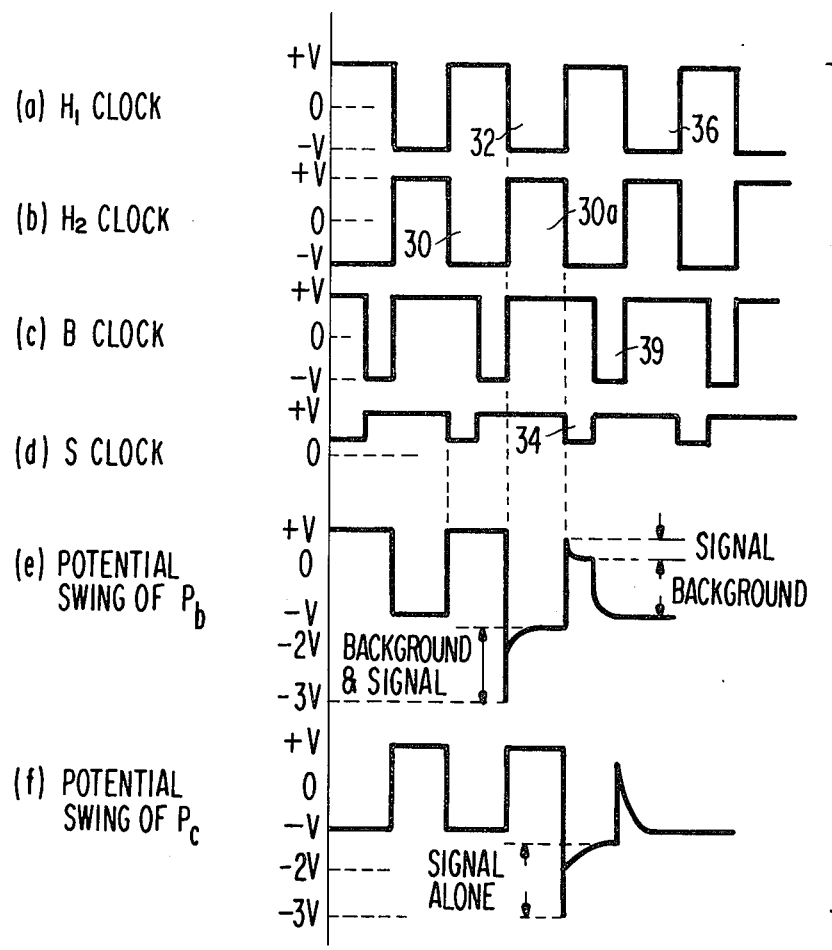
FIG. 2 is a drawing of waveforms to help explain the operation of the circuit of FIG. 1.

In the discussion of the operation of the circuit of FIG. 1 which follows, both FIGS. 1 and 2 should be referred to. The transistors may be assumed to be P type MOS transistors so that their conduction paths are placed in their low impedance condition in response to a relatively negative pulse applied at the gate electrode. In response to the first negative-going $H_2$ clock pulse 30, the signal present at 12 becomes stored as a charge on capacitor 31. In response to the following negative-going $H_1$ clock pulse 32, transistor 16 is rendered conductive. Concurrently the positive-going $H_2$ clock pulse 30a turns off transistor 14 and makes node $P_a$ more positive. The signal presents at node $P_a$ thereupon transfers to node $P_b$, that is, it becomes stored in capacitor 33. This is the conventional bucket-brigade signal transfer operation.

Immediately following the negative-going portion 32 of the $H_1$ clock pulse, the relatively shorter duration, lower amplitude signal-separation S clock pulse 34 occurs. The amplitude of this clock pulse sets the gate potential of transistor 20 thereby determining the lowest potential to which the transistor source electrode can fall before the conductance of the transistor is pinched off by the drop in potential at $P_b$. Adjustment of the amplitude of the signal separation clock pulse therefore very accurately controls the "skimming" threshold. In other words, the amplitude of pulse 34 indicates the level of signal at node $P_b$ above which level signal will be transferred to node $P_c$.

Summarizing the operation up to this point, a charge signal produced at an image sensing location has been transferred to node $P_b$ and that portion of the charge signal of greater than a given threshold level has been skimmed from the remainder of the singal and passed to node $P_c$. This signal $P_c$, in other words, is stored as a charge on capacitor 35. The stage 20, 35 can be considered a buffer stage.

Immediately after the S clock signal, the background removal clock signal B (identified by the numberal 39) occurs. This causes transistor 18 to conduct heavily and to transfer any charge remaining on capacitor 33 to an output circuit such as a drain bus. Thus, the small portion of the charge signal of greater than a given level has been passed to node $P_c$ of the circuit and the remaining portion of the charge signal has been discarded.

The signal at $P_c$ subsequently may be transferred to an output circuit in response to the next $H_1$ clock signal 36. This clock signal causes transistor 22 to conduct and the charge present at node $P_c$ transfers to capacitor 37.

In this form of the circuit, the capacitor 33 has a capacitance substantially larger than the capacitance 35. This causes the potential drop across capacitor 33 to be considerably less than the rise in potential at capacitor 35 when the charge signal is transferred to node $P_c$. If node $P_c$ or any subsequent node has the same reduced capacitance connected to the gate electrode of a transistor, the operation of the transistor will be improved by this increased voltage swing.

Figure 3:
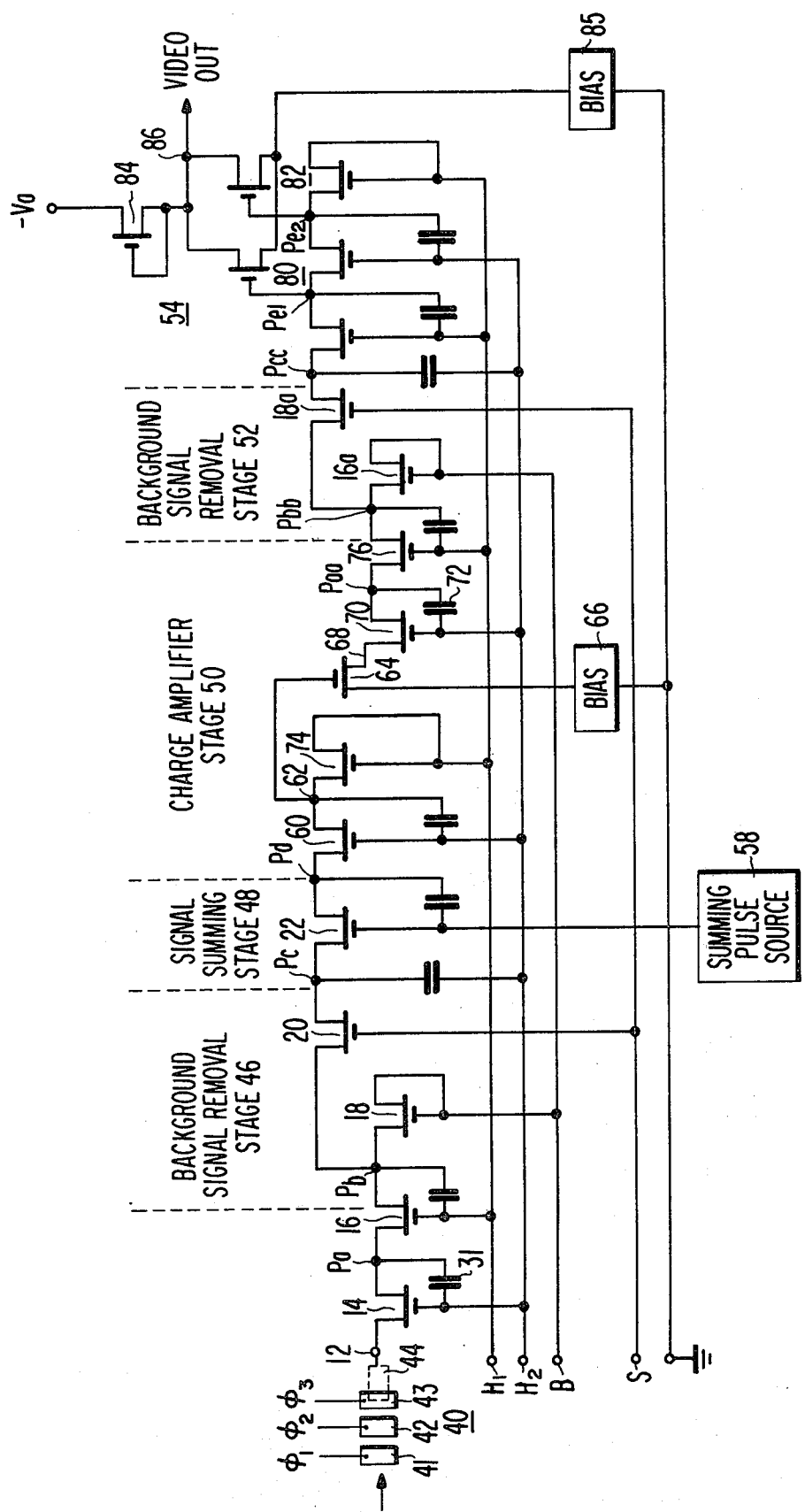
FIG. 3 is a block and schematic circuit diagram of another embodiment of the invention.

The circuit of FIG. 3 includes a background removal stage of the type shown in FIG. 1 and includes also circuits for performing additional functions. A row of a charge transfer image-sensing array is illustrated schematically at 40 by the three elements 41, 42, 43 which together constitute the last stage of a row which is operated in three phase fashion. It can be considered for purposes of this explanation that the row is either of the bucket-brigade or of the charge-coupled type. The coupling to the input node 12 can be via a diffusion 44.

The background removal stage 46 operates in the same way as the FIG. 1 circuit. The signal summing stage 48 is for the purpose of summing the signals obtained from each of three successive stages of the row of the image-sensing array, as will be discussed in more detail later. The charge amplifier stage 50 is for the purpose of amplifying the summed signal. The background signal removal stage 52 operates in the same general way as stage 46 and its purpose is to skim off only a portion of the output signal of the amplifier, that portion of the signal above a predetermined amplitude level, and to pass it to the following stage 54. Stage 54 is for the purpose of removing serrations in the output signal due to the $H_1$ and $H_2$ clock pulses.

Figure 4:
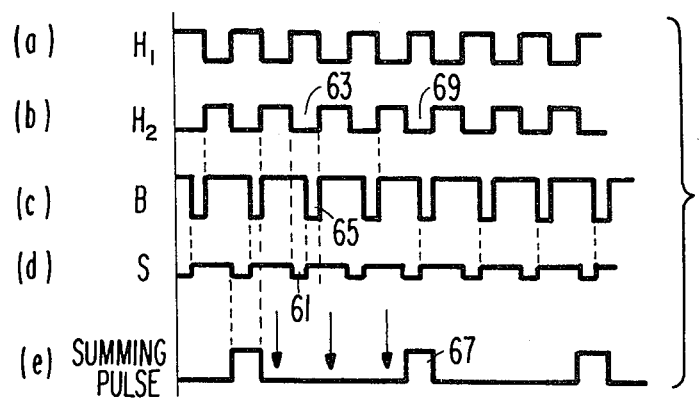
FIG. 4 is a drawing of waveforms to help explain the operation of the circuit of FIG. 3.

In the discussion which follows of the operation of the curcuit of FIG. 3, both FIGS. 3 and 4 should be referred to. The transistors may be assumed to be P type MOS transistors.

After an outputs signal is shifted to node 12 in response to the three phase signals $\phi 1$, $\phi 2$ and $\phi 3$, the clock pulse $H_2$ goes negative causing the video signal at 12 to be stored at node $P_a$. The next time clock pulse $H_2$ goes negative, this signal is shifted from node $P_a$ through the conduction channel of transistor 16 is stored at node $P_b$. The gate electrode of transistor 22 is maintained at a relatively negative potential by means 58 during the interval that summing is desired so that the conduction path of this transistor is in a conducting condition. This potential is sufficiently negative that node $P_d$ also is negative to an extent such that no signal passes through the conduction path of the following transistor 62 when $H_2$ is negative. Thus the "skimmed" signal transmitted from node $p_b$ to $P_c$ in response to an S pulse such as 61 of FIG. 4, passes to summing node $P_d$ during each positive half cycle of the $H_2$ clock signal but is retained on node $P_d$ throughout all negative cycles of clock signal $H_2$ until the pulse 67 occurs.

After pulse S terminates, the background separation pulse B occurs. In response to this pulse (65 in FIG. 4), the charge remaining at node $P_b$ is removed via the conduction path of transistor 18 to a drain bus and the node $P_b$ is reset to a reference level in the processs.

In the embodiment of the invention illustrated, the process described above is repeated three times, that is, for three successive clock pulses $H_2$ or three successive signal separation pulses S. What this means, in effect, is that node $P_d$ sums the skimmed signal removed from three successive register stages, that is, removed from nine register elements (only three such elements 41, 42 and 43 making up the single stage being shown in FIG. 3). It is to be understood, of course, that this is an example only as the signal present at less than or more than three stages can be summed.

At the termination of the summing interval, the summing pulse source 58 applies a positive pulse (such as 67, FIG. 4) to the gate electrode of transistor 22 to cause the summed signal present at node $P_d$ to become relatively positive and to concurrently turn-off transistor 22. Node $P_d$ also can be considered the input terminal of the charge amplifier stage 50. In response to the pulse 67 and the concurrent $H_2$ clock signal 69, this charge signal transfers to node 62 which is connected to the gate electrode of transistor 64. The amount of conduction which occurs through this transistor is now controlled by the level of the charge signal present at node 62 (the more charge signal the smaller the amount of conduction through 64). Note that one end of the conduction path of transistor 64 is maintained at a bias level by source 66 such that conduction can occur through this transistor, the signal at 62 being amplified and inverted in the process. The same $H_2$ clock pulse causing the transfer of charge signal to node 62 also turns on transistor 70 so that the amplified charge signal at 68 becomes stored in capacitor 72, said signal appearing at node $P_{aa}$.

The following $H_1$ clock signal which occurs turns on transistor 74, the purpose of which is to reset node 62 to a reference voltage level, namely the level of the clock signal $H_1$. The same clock signal $H_1$ is applied to the gate electrode of transistor 76 to transfer the signal at node $P_{aa}$ to node $P_{bb}$. Node $P_{aa}$ can be considered to be comparable to node $P_a$ at the input end of the circuit. The transistors 16a and 18a perform functions similar to those performed by transistors 16 and 18. All of these elements form a background signal removal stage and their purpose is to reduce the amplitude of output signal of the amplifier to a manageable level by removing that portion of the signal of lower than a given amplitude and discarding it and using only the remaining portion, that is, the portion greater than the threshold level.

The circuit 54 is in itself a known circuit and is the subject of copending application Ser. No. 186,078 now Pat. No. 3,746,883, for "Charge Transfer Circuits" filed Oct. 4, 1971 by Michael G. Kovac and assigned to the same assignee as the present application. In brief, the two transistors 80 and 82 are connected to operate as source followers connected in a differential amplifier configuration. The transistor 84 is connected to operate as a common load resistor. Assuming P type transistors, operating voltage $-V_a$ is at a relatively low value, chosen on the basis of the signal input values ($P_{e1}$ and $P_{e2}$) anticipated. This voltage which is applied to the source electrodes of transistors 80 and 82 determines the point at which the negative going portion of a signal present at a point such as $P_{e1}$ will cause a source follower such as 80 to start to conduct. The bias voltage source 85 may be at some relatively substantially more negative voltage than $-V_a$, such as $-30$ volts or so in some practical circuits, to maintain the drain electrodes of the transistors more negative than the source electrodes.

When signal is transferred to the output node $P_{e1}$ in response to the negative clock $H_1$, transistor 80 is turned on by the relatively negative voltage at $P_{e1}$ and video output signal appears at the "video out" terminal 86. Transistor 82 is off at this time. When this signal is transferred to node $P_{e2}$ in response to the following negative clock $H_2$ source follower 82 is turned on and produces an output at the same level at output terminal 86. Transistor 80 is off at this time. Thus, for one complete period of the H clock pulses, the video output signal appears at a constant level at output terminal 86. No serrations due to these clock pulses are present because the circuit effectively continues to "look at" the same signal, first while it is one node $P_{e1}$ and then while it is at the second $P_{e2}$.

Figure 5:
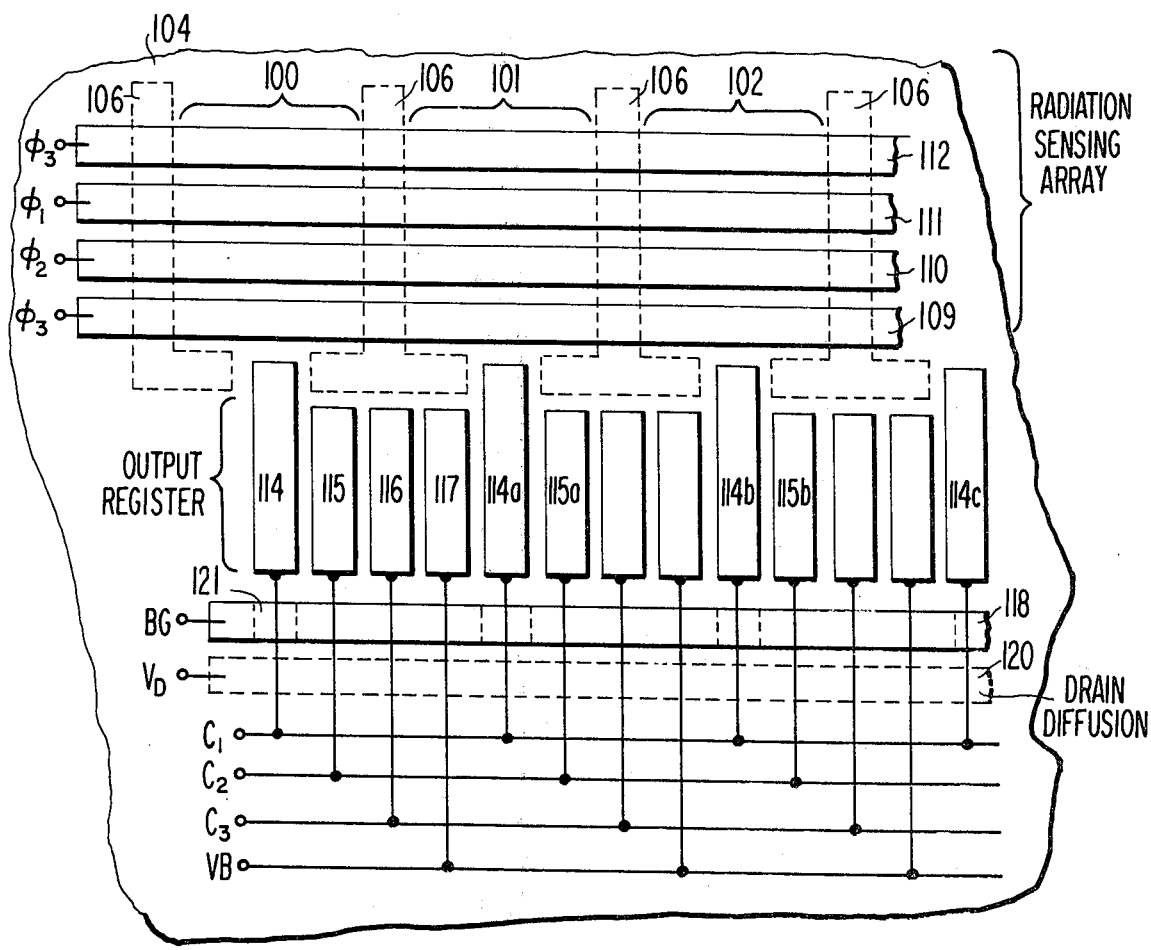
FIG. 5 is a plan view of a charge coupled circuit embodiment of the present invention.

The circuit of FIG. 5 is a charge-coupled circuit which performs both the skimming and summing functions. Three charge-coupled columns of a radiation sensing array are illustrated at 100, 101 and 102 respectively. Each such column, sometimes known as a "channel", comprises a semiconductor substrate 104 such as one formed of N type silicon, so called channel stops 106 are diffusions in the substrate of the same conductivity as the substrate and more highly doped than the substrate, and conductors, four of which are shown at 109, 110, 111 and 112, insulated from but electrically coupled to the substrate. The channel stop diffusions are for the purpose of isolating each column or channel from the next adjacent channels. The conductors 109-112 are driven by a multiple phase voltage source such as a three-phase source in the manner shown schematically, and their purpose is to provide surface potentials at the semiconductor substrate for the storage and propagation of the surface charge signal. The radiation sensors of the array may be diffusions at each element location or, in some charge coupled sensors, the reverse-biased surface of the silicon serves as a photosensitive array. Radiation sensing arrays of this kind are now well known and need not be discussed in detail here.

The conductors, for the first of which are legended 114-117, respectively, are the conductors of an output register. Like the conductors 109-112, the register conductors are insulated from and electrically coupled to the substrate. Their purpose is to receive the charge signal shifted down the respective columns and to sum a plurality of such in a manner shortly to be discussed.

The conductor 118 comprises a gate electrode and its purpose is to control the flow of charge to the drain bus 120. The latter is a diffusion in the substrate and is maintained at a negative potential $V_D$ (when the substrate 104 is of N type). The gate electrode 118 is coupled to the substrate only in the regions within the dashed lines. That is, when the gate electrode is activated, charge present in electrodes 114, 114a, 114b and 114c will be conducted through the conduction paths formed beneath the regions of the gate electrode within the dashed lines to the drain diffusion. Throughout the remainder of the extent of electrode 118, it is spaced relatively far from the substrate and no conduction channel forms, for example, between electrodes such as 115, 116, and 117 and the drain diffusion.

In discussing the operation of the radiation sensing array, it will be assumed as already mentioned, that the substrate is formed of N type silicon so that the minority charge carriers are holes. This means that negative potentials $\phi_1-\phi_3$ are necessary to form the required potential wells for the accumulation of such holes. Also, the remaining potentials are made relatively negative, when it is desired to accumulate charge or to receive charge.

The operation of the system of FIG. 5 will be discussed in terms of one column of the array and one stage of the output register. The remaining columns and stages operate in similar fashion.

During one set of three phase clock signals, the control voltage $C_1$ is made relatively negative to accumulate the charge signal shifted from the last stage of the register. The plate 115 can be considered to a transfer gate. It may be at a potential $C_2$ close to ground potential during the accumulation of charge beneath plate 114. Then, still during the time $C_1$ is negative, $C_2$ is made more negative to cause the potential hill beneath plate 115 to lower. The value of potential $C_2$ must be precisely controlled to control the height of this potential hill, that is, to control the threshold level above which charge stored beneath plate 114 transfers. During this time, plate 116 is maintained sufficiently negative by control voltage $C_3$ to form a relatively deep potential well beneath this electrode, preferably deeper than that beneath plate 114. Thus, in response to the actions just described, the portion of the charge signal of greater than a given amplitude stored beneath plate 114 transfers over the lowered potential hill beneath transfer gate 115 to the potential well beneath electrode 116. This is the skimmed portion of the charge signal.

After the skimming operation discussed above, the voltage BG is made negative to form conduction channels between electrodes such as 114 and the drain diffusion 120. This causes the charge stored beneath electrode 114 to transfer via the conduction channel beneath the portion 120 of the gate electrode 118 to the drain diffusion. The drain diffusion is maintained at a value sufficiently negative to "sink" the positive minority carriers (holes). If desired, during this operation the control signal $C_2$ may be made less negative to increase the height of the potential hill between electrodes 114 and 116 to prevent the transfer of any charge from beneath electrode 114 to beneath electrode 116. In addition, if desired the potential at $C_1$ can be made less negative during the transfer of the charge signal beneath plate 114 to the drain diffusion to accelerate the charge transfer.

The final gate 117 is maintained at potential $V_B$ which may be close to ground or perhaps even slightly negative so that a potential barrier is formed between the electrode 116 and the following electrode 114a. The purpose of this barrier is to prevent the escape of charge stored beneath plate 116 to the input of the following registers stage and vice-versa.

The process described above may be repeated several times to effect the summing of the signal for several stages of the radiation sensing array at plate 116. In other words, the circuit may be operated in such a way that the skimmed signal from each of say two or three or four successive stages of a channel or column accumulates beneath a plate such as 116. After such accumulation, the signals may be shifted out of the output register by the application of multiple phase shift voltages at the $C_1$, $C_2$, $C_3$ and $V_B$ terminals, respectively. In the arrangement illustrated, these four voltages may be four phase signals. As an alternaltive, with proper bias voltages applied to alternate electrodes, two-phase signals may be applied to terminals $C_1+C_2$ and $C_3+V_B$ for shifting out the contents of the output register.

Figure 6:
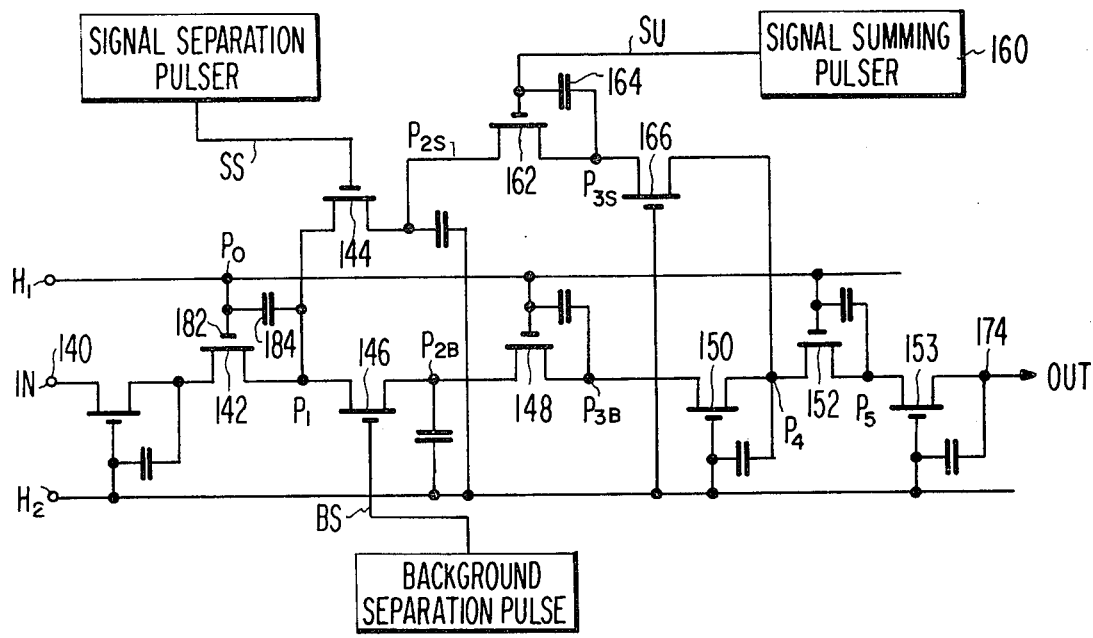
FIG. 6 is a block and schematic circuit diagram of another bucket-brigade embodiment of the invention.

The embodiment of the invention as shown in FIG. 6 is a bucket-brigade circuit which employs N type transistors. Here the input signal at terminal 140 is shifted to node $P_0$ in response to the positive going portion of clock pulse $H_2$. The next clock pulse $H_1$ shifts this signal through transistor 142 to node $P_1$; the signal separation pulse SS is now generated and it causes that portion of the charge signal at node $P_1$ which exceeds a given threshold level to pass through the conduction path of transistor 144 to node $P_{2s}$. The remaining portion of the signal at node $P_1$ is then transferred through the conduction path of transistor 146 to node $P_{2b}$ in response to the background separation pulse BS.

Up to this point, the operation discussed is somewhat similar to that already described in connection with other embodiments of the invention. However, in the embodiment of FIG. 6 rather than removing the background signal passing through transistor 146 and eliminating it entirely, it is instead shifted through the conduction path of transistor 148 to node $P_{3b}$ and then through the conduction path of transistor 150 to node $P_4$, and then through the conduction path of transistor 152 to node $P_5$. Thus, the background signal from each input charge signal passes through two transistors 148 and 150 and then through transistors 152 and 153 to the output terminal. However, the portion of the input signal which is skimmed may be permitted to accumulate in the manner shown in FIG. 7.

Accumulation takes place at node $P_{3s}$ of what can be considered a buffer stage. During the summing interval, the signal summing pulser 160 applies a positive voltage to the gate electrode of transistor 162. As already mentioned, this transistor (and the others) are N type transistors so that the relatively positive signal maintains the conduction path of transistor 162 at a relatively low value of impedance. Accordingly, each time the signal separation pulse SS is applied to the gate electrode of transistor 144, the skimmed signal which transfers to node $P_{2s}$ passes through the conduction path of transistor 162 and becomes stored in capacitor 164, that is, it becomes stored as a relatively negative signal at node $P_{3s}$. The signal $H_2$ which occurs during the signal summing interval has no effect on the signal present at node $P_{3s}$. The reason is that the voltage at $P_{3s}$ is not sufficiently negative for transistor 166 to conduct while the positive portion of the summing signal is present, even though the gate of transistor 166 is pulsed each time the clock pulse $H_2$ occurs.

Figure 7:
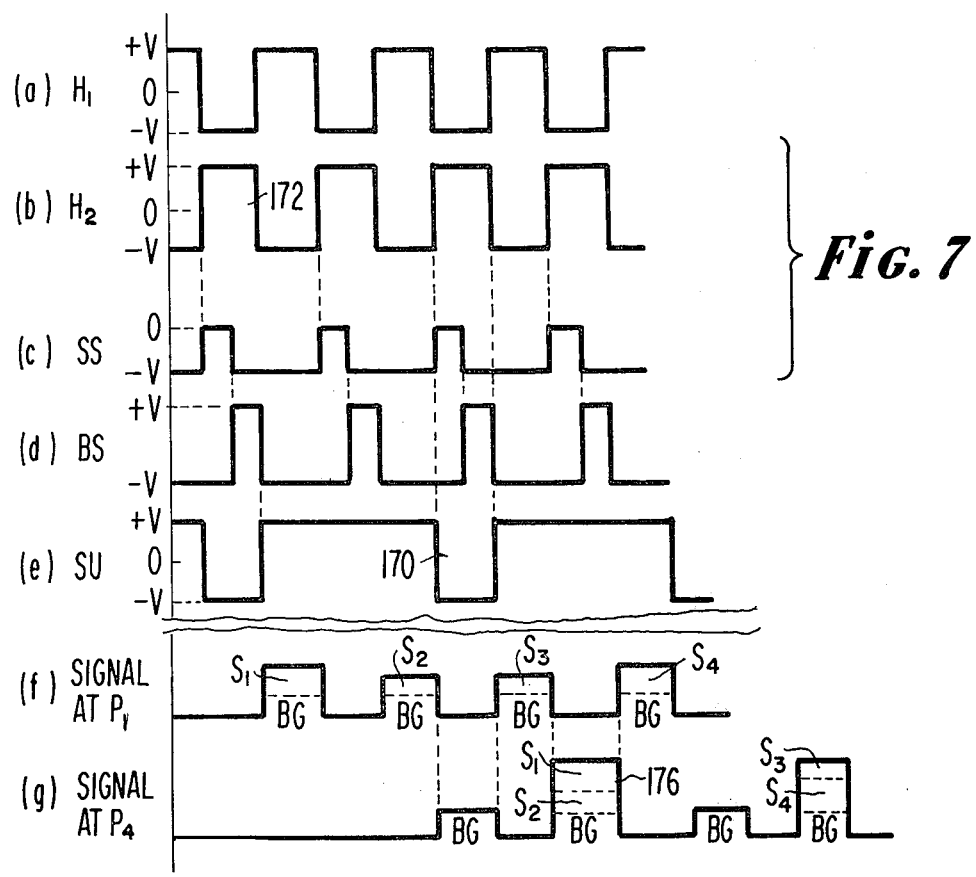
FIG. 7 is a drawing of waveforms to help explain the operation of the circuit of FIG. 6.

At the end of the summing interval, the summing pulser output signal SU goes negative. In the present example, this negative part of the signal is shown at 170 in FIG. 7 and it occurs after two periods of the $H_2$ clock pulse. During these two periods, two skimmed signals $S_1$ and $S_2$ accumulate at node $P_{3s}$. When SU goes relatively negative, the summed skimmed signal at node $P_{3s}$ goes negative to the same extent. At the same time, the positive $H_2$ clock pulse 172 is applied to the gate electrode of transistor 166. This causes the transfer of the summed skimmed signal through the conduction path of transistor 166 to node $P_4$ of the buffer stage. At the same instant of time, the positive $H_2$ clock pulse 172 is applied to the gate electrode of transistor 150, causing the background level signal to shift to node $P_4$. These two signals add at this node and one clock period later appear at output terminal 174 as illustrated at g in FIG. 7. Note that this signal 176 consists of the sum of two skimmed signals $S_1$ and $S_2$ combined with one background signal level. Note also that to conserve space, the time scale in FIGS. 7f and 7g is shifted to the left relative to FIGS. 7a–7e.

An advantage of the circuit of FIG. 6 is that there is always background present at some fixed and predetermined level. The constant background signal serves to maintain the transfer efficiency at its highest value independently of how many adjacent elements have their signals summed. Also, a more accurate black level can be established in the display when the background signal level remains constant.

Figure 8:
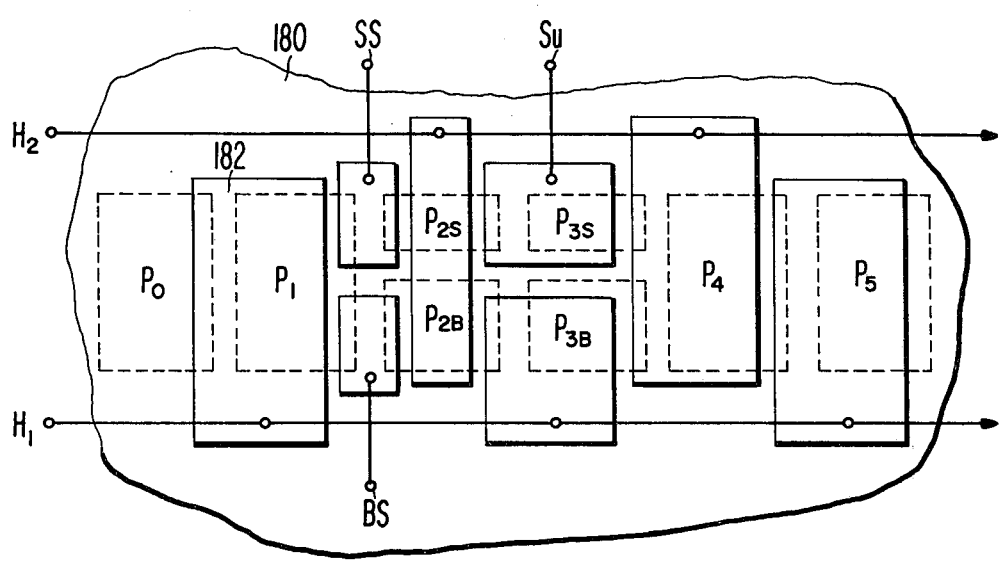
FIG. 8 shows one layout for the circuit of FIG. 6.

FIG. 8 merely represents one way in which the charge-coupled circuit of FIG. 6 may be laid out on a substrate 180. The dashed areas are diffusions in the substrate and they have been legended by the same characters as employed in FIG. 6. A plate such as 182 serves as the gate electrode 182 of transistor 142 of FIG. 6. The capacitance 184 of FIG. 6 is the capacitance between the plate 182 and the diffusion $P_1$, which diffusion operates as the drain electrode of transisto 142 and the source electrode of the following transistor 146. The correspondence between the remaining structure of FIG. 8 and FIG. 6 is self-evident and need not be discussed in detail.

What is claimed is:

1. A method for improving the contrast among a plurality of charge signals concurrently produced by a corresponding plurality of radiation sensors of an image sensing array, each charge signal representing the intensity of a different element of the scene being viewed by said array, comprising the steps of:
    discarding that portion of each charge signal which is lower than a given amplitude level corresponding to a given background signal level;
    employing the remainder of each charge signal as the signal representing the radiation received by the radiation sensor producing that signal; and
    increasing the signal intensity at the expense of signal resolution by combining into a single charge signal, each group of N such remainder signals derived from N adjacent radiation sensors, respectively, where N is an integer greater than one.

2. The method of claim 1, further including the step of: adding to each combined signal a background signal at a fixed signal level.

* * * * *